United States Patent [19]

Hanajima et al.

[11] 4,232,267
[45] Nov. 4, 1980

[54] DIGITAL SIGNAL SELECTIVE CIRCUIT

[75] Inventors: Hidemitsu Hanajima, Atusgi; Yasuo Shigeta, Yokohama, both of Japan

[73] Assignee: Sony Corporation, Tokyo, Japan

[21] Appl. No.: 909,392

[22] Filed: May 25, 1978

[30] Foreign Application Priority Data

Jun. 1, 1977 [JP] Japan .................... 52-63256

[51] Int. Cl.² .................... H03K 5/153; H03K 13/00; H03K 9/06
[52] U.S. Cl. .................... 328/138; 328/141; 328/129; 340/171 R; 329/126; 328/119
[58] Field of Search ............. 328/48, 119, 129, 130, 328/138, 140, 134, 141; 340/171 R; 329/126

[56] References Cited

U.S. PATENT DOCUMENTS

| | | | |
|---|---|---|---|
| 3,044,065 | 7/1962 | Barney et al. | 328/48 X |
| 3,579,126 | 5/1971 | Paul | 328/129 |
| 3,660,842 | 5/1972 | Ballantyne | 328/48 X |
| 3,745,475 | 7/1973 | Turner | 328/48 X |
| 3,868,845 | 3/1975 | Shimizu | 328/129 X |
| 4,052,676 | 10/1977 | Crittenden | 328/129 X |
| 4,158,148 | 6/1979 | Teller | 328/138 X |

FOREIGN PATENT DOCUMENTS 858275 1/1961 United Kingdom ............. 328/138
1458891 12/1976 United Kingdom ............. 328/138

*Primary Examiner*—John S. Heyman
*Attorney, Agent, or Firm*—Lewis H. Eslinger; Alvin Sinderbrand

[57] ABSTRACT

A digital signal selective or detecting circuit which is responsive to a periodic input signal having a frequency within a specified range, such as an audio frequency used as a cueing signal in a VTR, only when the signal in such frequency range exists for a predetermined time; includes a clock pulse generator providing reference clock pulses, a first counting circuit counting the reference clock pulses whenever the periodic signal is present, a circuit providing a counting pulse whenever an operating characteristic of the periodic signal, such as the transition between its positive and negative portions, occurs at a time when the count in the first counting circuit is between first and second predetermined counts, and a second counting circuit counting each counting pulse and providing an output when the second counting circuit attains a predetermined count. Preferably a Schmitt trigger is employed for shaping the periodic input signal, and a JK bistable multivibrator is associated with the Schmitt trigger and the clock pulse generator for synchronizing the output of the Schmitt trigger with the reference clock pulses.

20 Claims, 18 Drawing Figures

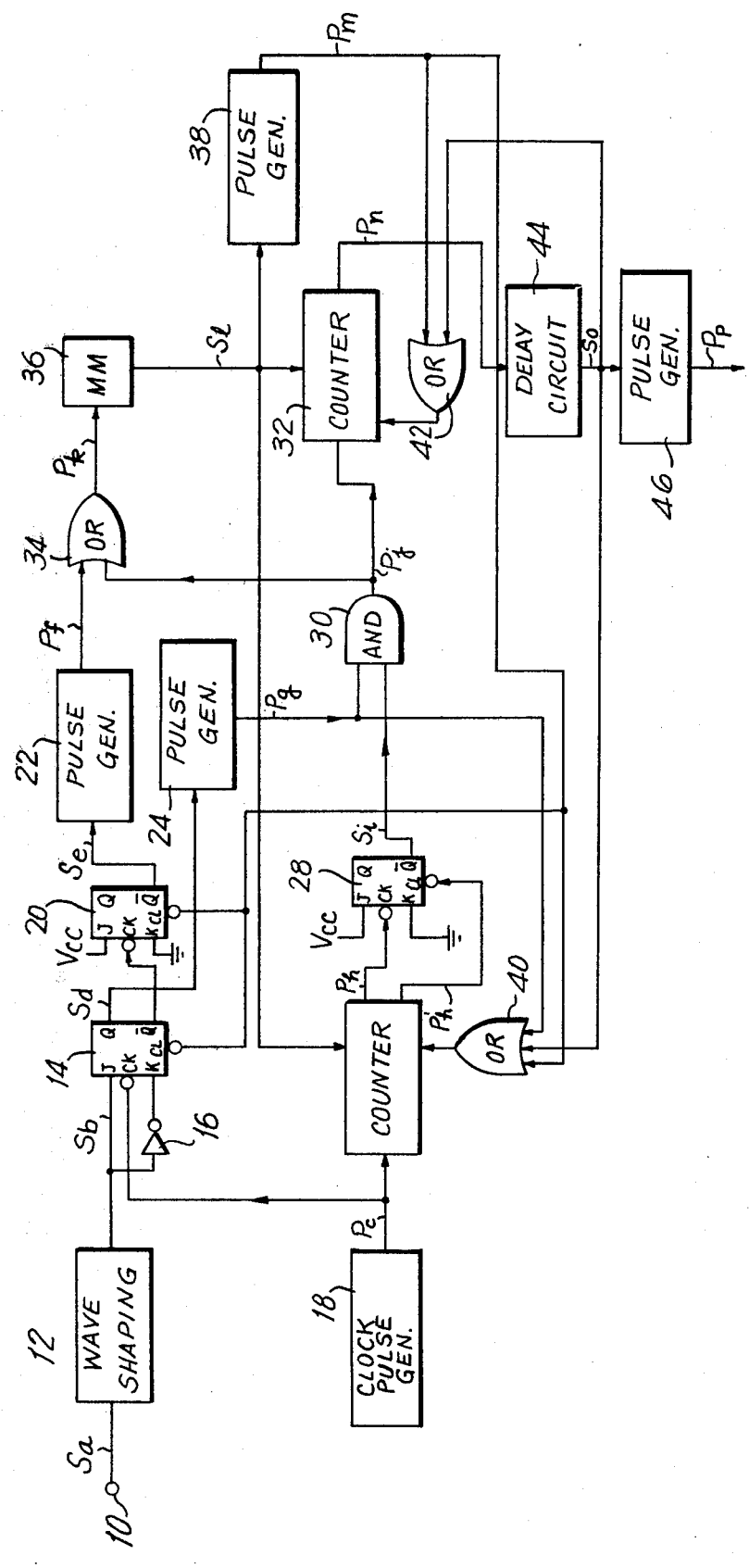
FIG. I

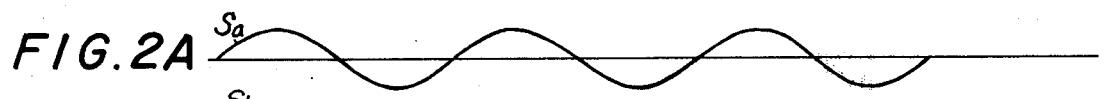
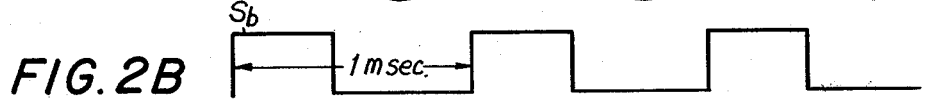
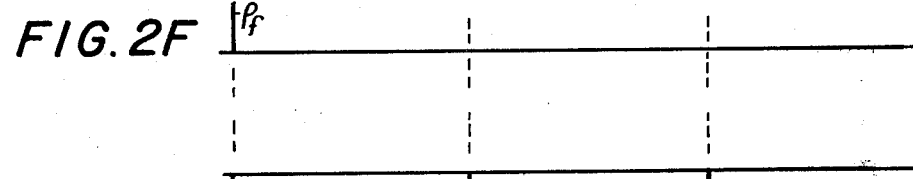
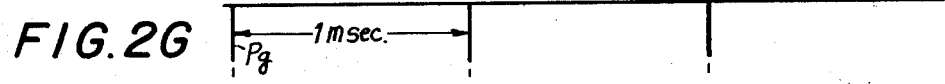
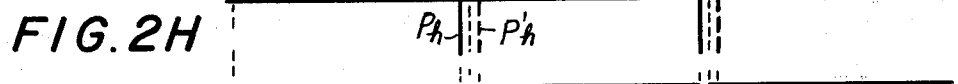
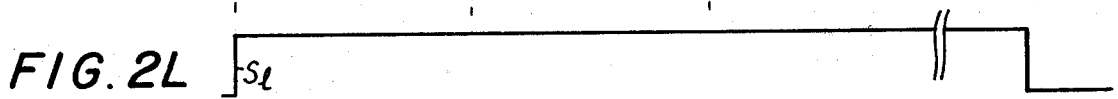
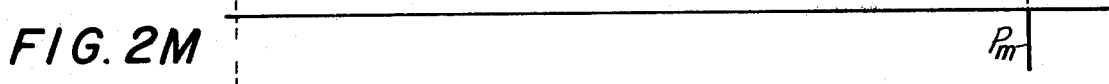
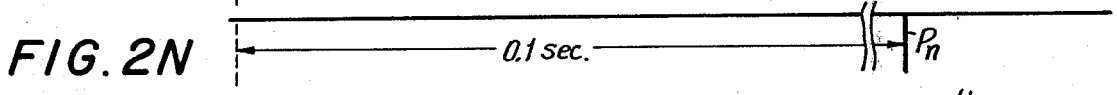
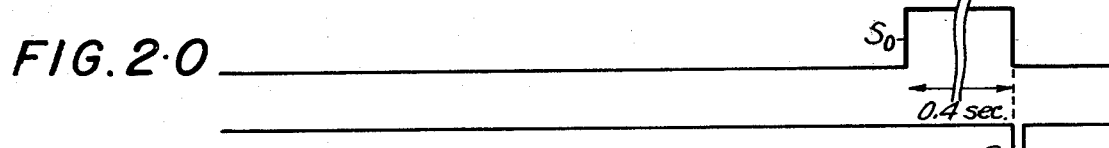

DIGITAL SIGNAL SELECTIVE CIRCUIT

BACKGROUND OF THE INVENTION

1. Field of the Invention

The present invention relates to a digital signal selective or detecting circuit for providing an output signal in response to a periodic input signal which has a frequency within a specified range for a predetermined time. In particular, the present invention relates to a digital signal selective circuit suitable for use with a video tape recorder (VTR) and responsive to a cue signal recorded on a video tape used in the VTR.

2. Description of the Prior Art

Frequency detecting circuits have been proposed for detecting an indication or command signal which maintains a predetermined frequency for a predetermined length of time in order to initiate the operation of various associated systems. For instance, such frequency detecting circuits are commonly found in such widely ranging applications as remotely controlled automatic garage door openers and automatic telephone answering machines. However, prior art frequency detecting circuits employ analog rather than digital techniques. A typical analog frequency detecting circuit incorporates a resonance filter, such as a tank circuit, a reed filter, an electromechanical filter, or a time-constant circuit. In such analog circuits, detection errors often occur because of detector instability whenever an incoming waveform is distorted. In addition, it is difficult to adjust the alignment and bias of the various elements in an analog circuit. Further, in prior art analog frequency detecting circuits, it is difficult to change the response or detected frequency.

OBJECTS AND SUMMARY OF THE INVENTION

Accordingly, it is an object of the present invention to provide a digital signal selective or detecting circuit responsive to a periodic input signal which has a frequency within a specified range for at least a predetermined time, and which is free from the above-mentioned defects of the prior art.

More specifically, it is an object of the present invention to provide a digital frequency selective or detecting circuit, as aforesaid, which is of relatively simple construction, and suitable for use with a VTR for detecting cue signals recorded on a video tape used in the VTR.

According to an aspect of the invention, a digital signal selective or detecting circuit responsive to a periodic input signal having a frequency within a specified range for a predetermined time, includes a clock pulse generator providing reference clock pulses, first counting means counting the reference clock pulses whenever the periodic signal is present, a circuit for providing a counting pulse whenever a particular operating characteristic of the periodic signal, such as, a transition between portions of the input signal which are positive and negative in respect to a reference level, occurs at a time when the count in the first counting means falls between first and second specified counts, and second counting means counting each counting pulse and providing an output when the second counting means attains a predetermined count. Preferably, means are provided to reset the counting means, and thereby to prevent the same from attaining respective predetermined counts, whenever the frequency of the periodic input signal is outside the specified range of frequencies.

Because the second counting means operates only if the described transition or other operating characteristic of the periodic input signal occurs while the first counting means is between first and second predetermined counts, and because an output is produced only when the second counting means attains a predetermined count therein, the signal selective or detecting circuit accurately detects those signals which have a frequency in the predetermined frequency range and which exist for at least a predetermined length of time.

BRIEF DESCRIPTION OF THE DRAWINGS

FIG. 1 is a block diagram showing an embodiment of a digital signal selective or detecting circuit according to the present invention;

FIGS. 2A–2P are waveform diagrams to which reference will be made in explaining the operation of the digital signal selective circuit of FIG. 1.

DETAILED DESCRIPTION OF THE PREFERRED EMBODIMENT

Figure 3:
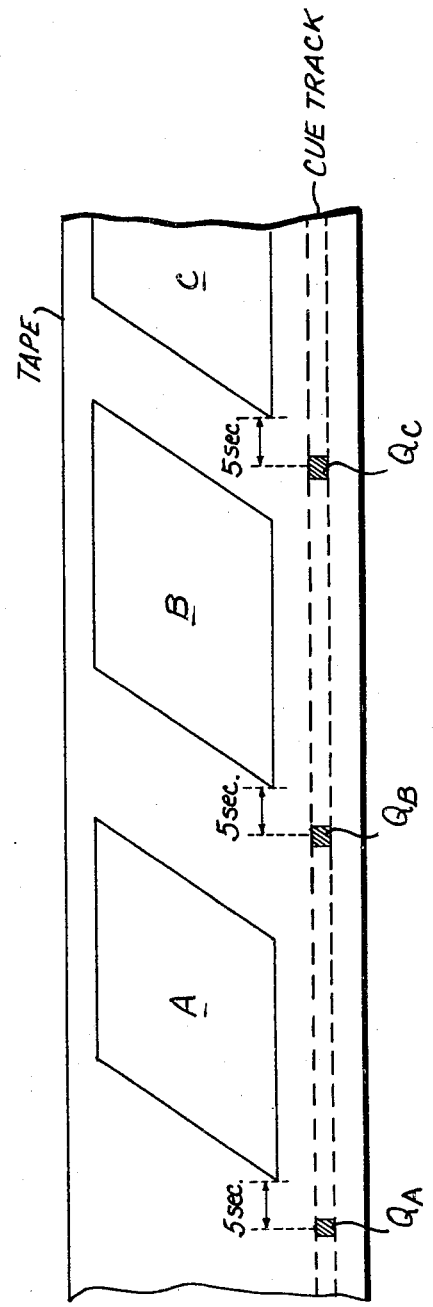
FIG. 3 shows a diagrammatic view of a segment of a video tape on which cue signals are recorded.

Referring to the drawings in detail, and initially to FIG. 1 thereof, it will be seen that a digital signal selective circuit according to the present invention is intended to be responsive to an input signal $S_a$ of a predetermined frequency, for example, a 1 KHz tone or oscillation which may be a cue signal recorded on a video tape and suitably reproduced for application to an input terminal 10. The input terminal 10 is connected to a waveshaping circuit 12, which is preferably a Schmitt trigger. The output $S_b$ of the waveshaping circuit 12 is supplid to a J input terminal of a first JK flip-flop 14, and also through an inverter 16 to a K input terminal of JK flip-flop 14. A clock pulse generator 18 provides reference clock pulses $P_c$, for example, at a frequency of 100 KHz and with a duty cycle of 50%. The reference clock pulses $P_c$ are supplied to a clock terminal CK of the first JK flip-flop 14. The first JK flip-flop 14 has an output terminal Q and an inverse output terminal $\bar{Q}$, and the inverse output terminal $\bar{Q}$ is connected to a clock input terminal CK of a second JK flip-flop 20. The J and K terminals of the second JK flip-flop 20 are connected to a voltage source, for example, as represented by a reference potential $V_{cc}$ and to ground, respectively. The second JK flip-flop 20 has an inverse output terminal $\bar{Q}$ which is connected with a first pulse generator 22. The Q output terminal of first JK flip-flop 14 is connected to a second pulse generator 24.

The reference clock pulses $P_c$ from clock pulse generator 18 are further applied to an input of a first counter 26. In the illustrated example, counter 26 is capable of counting to a count of at least 106 before returning to 0. Counter 26 may consist of a pair of decade counters connected in series. Counter 26 has a first output connected with a third JK flip-flop 28 to apply a pulse $P_h$ to the clock input CK thereof when a count of 95 is present in counter 26. Another output of counter 26 provides a pulse $P'_h$ to the clear terminal CL of third JK flip-flop 28 whenever a count of 106 is present in counter 26. The J and K input terminals of third JK flip-flop 28 are connected to a reference voltage $V_{cc}$ and to ground, respectively. A logic AND gate 30 has two inputs which respectively receive pulses $P_g$ from second pulse generator 24 and an inverse output $S_i$ from the inverse output terminal $\overline{Q}$ of third JK flip-flop 28. An output $P_j$ of logic AND gate 30 is applied, as a counting signal, to a second counter 32, and to an OR gate 34. Second counter 32 is, in the example being described, capable of counting to 99 before returning to 0, and provides an output pulse $P_n$ when the counter 32 attains a predetermined count, for instance, a count of 99. The counter 32 may consist of a pair of decade counters connected in series.

OR gate 34 provides an output $P_k$ whenever it receives either a first pulse $P_f$ from first pulse generator 22 or a counting pulse $P_j$ from AND gate 30. The output $P_k$ of OR gate 34 triggers a monostable multivibrator 36 which, in turn, provides a gating signal $S_l$ to gate terminals of counters 26 and 32 so that the counters 26 and 32 may count the respective inputs during the existence of signal $S_l$. The signal $S_l$ is further applied to a third pulse generator 38 which provides a reset pulse $P_m$ in response to the negative-going (trailing) edge of the gating signal $S_l$ provided by multivibrator 36. The reset pulse $P_m$ from third pulse generator 38 is applied through OR gates 40 and 42 to respective reset terminals of first and second counters 26 and 32. The reset pulse $P_m$ is also applied to respective clear terminals CL of first and second JK flip-flops 14 and 20. The output pulse $P_n$ from counter 32 is applied to a delay circuit 44 which provides a delayed signal $S_o$ 400 msec after counter 32 attains its predetermined count. The delayed signal $S_o$ is applied to inputs of OR gates 40 and 42 and to an output pulse generator 46. Further, OR gate 40 is connected with second pulse generator 24 to reset first counter 26 whenever a second pulse $P_g$ is generated.

In a particular example of a digital signal selective circuit according to this invention, an output pulse is provided from pulse generator 46 0.5 sec. after a cue signal of 1 KHz frequency is first applied to input terminal 10 for at least 0.1 seconds. More particularly, when the cue signal shown to have a sinusoidal waveform on FIG. 2A, is applied as the input signal $S_a$ through input terminal 10 to waveshaping circuit 14, the latter circuit provides a rectangular output waveform $S_b$ with a frequency (1 KHz) the same as that of the input signal $S_a$. As shown on FIG. 2B, the rectangular output waveform $S_b$ has a transition from one level to another corresponding to an operating characteristic of the input signal $S_a$, that is, corresponding to the transition of the signal $S_a$ from a positive portion to a negative portion thereof. The rectangular waveform $S_b$ is applied to the J terminal, and through inverter 16, to the K terminal of first flip-flop 14, while clocking pulses $P_c$, shown on FIG. 2C, are applied from generator 18 to the clock terminal of flip-flop 14. As a result, first JK flip-flop 14 provides, at its Q output terminal a rectangular wave $S_d$ (FIG. 2D) which is generally similar to waveform $S_b$ but synchronized with clocking pulses $P_c$. Flip-flop 14 provides, from its inverse output terminal $\overline{Q}$, a signal which is the inverse of signal $S_d$ and which is applied to the clock input CK of second flip-flop 20. Flip-flop 20 provides from its $\overline{Q}$ output terminal a signal $S_e$ (FIG. 2E) with a negative-going leading edge at the commencement of rectangular wave $S_d$. In response to signal $S_e$, first pulse generator 22 provides a first pulse $P_f$ (FIG. 2F) at the commencement of the rectangular wave $S_d$. Second pulse generator 24 provides second pulses $P_g$ (FIG. 2G) at 1 msec intervals in response to the positive-going leading edges of rectangular wave $S_d$. OR gate 34 provides a triggering pulse $P_k$ (FIG. 2K) to multivibrator 36 at a time corresponding to the commencement of rectangular wave $S_d$. Multivibrator 36 provides gating signal $S_l$ (FIG. 2L) to enable first and second counters 26 and 32 to count the clock pulses $P_c$ and counting pulses $P_j$, respectively. Upon receiving the gating signal $S_l$, first counter 26 commences registering a count in response to clock pulses $P_c$. When first counter 26 attains a predetermined count of 95, a pulse $P_h$, shown as a solid line in FIG. 2H, is applied to the clock terminal of third flip-flop 28, and when the counter 26 attains a second predetermined count of 106, a second pulse $P'_h$, shown as a broken line in FIG. 2H, is applied to the clear terminal of third flip-flop 28. The output signal $S_i$ (FIG. 2I) from the inverse output terminal $\overline{Q}$ of third flip-flop 28 is shown to have a transition from a first or high level to a second or low level in response to pulse $P_h$, and a transition from the second level back to the first level in response to pulse $P'_h$. The logic AND gate 30 provides a counting pulse $P_j$ (FIG. 2J) for each second pulse $P_g$ from pulse generator 24 occurring while output signal $S_i$ is at its second or low level. Counting pulse $P_j$ is also supplied through OR gate 34 as a triggering pulse $P_k$ for multivibrator 36. Thus, gating signal $S_l$ (FIG. 2L) will be continuously provided to the gate terminals of first and second counters 26 and 32 so long as there is a continuous succession of counting pulses $P_j$. Further, so long as a 1 KHz input signal $S_a$ is applied to input terminal 10, counting pulses $P_j$ will be applied to the input of second counter 32 to be counted by the latter during reception of the gating signal $S_l$. When counter 32 attains its predetermined count, an output pulse $P_n$ (FIG. 2N) is provided therefrom to the delay circuit 44. Because counting pulses $P_j$ occur at 1 msec intervals and second counter 32 counts from 0 to 99, the output pulse $P_n$ occurs 100 msec (0.1 sec) after the commencement of the input signal $S_a$. Delay circuit 44 provides delayed signal $S_o$ (FIG. 2O) for 400 msec (0.4 sec) after receiving output pulse $P_n$. The output pulse generator 46 provides a pulse $P_p$ (FIG. 2P) at the falling-down or trailing edge of signal $S_o$, and which is, therefore, delayed 0.5 seconds in respect to the commencement of input signal $S_a$. The falling down or trailing edge of delayed signal $S_o$ is also used to reset counters 26 and 32 at the end of the 0.5 second interval. In addition, first pulse $P_g$ from generator 24 is applied to reset the first counter 26, and thereby prevent signal frequencies which are harmonics of the 1 KHz signal $S_a$, for instance, the second harmonic with a frequency of 2 KHz, from being mistakenly detected as the desired 1 KHz signal.

Pulse generator 38 provides the reset pulse $P_m$ (FIG. 2M) to reset terminals of first and second counters 26 and 32 in response to the trailing edge, or negative-going portion of gating signal $S_l$. Multivibrator 36 should be selected to have a time constant greater than the normal period of the input signal $S_a$ which is to be detected. In the case where the signal $S_a$ to be detected has a frequency of 1 KHz, that is, a period of 1 msec., multivibrator 36 preferably has a time constant of 1.5 msec., that is, provides the gating signal $S_l$ for 1.5 msec. in response to each triggering pulse $P_k$. Thus, reset pulse $P_m$ will be provided whenever counting pulses $P_j$ occur at intervals greater than the time constant of multivibrator 36. If the time constant of multivibrator 36 is selected to be greater than 1.0 msec., for example, 1.5 msec, as described above, reset pulse $P_m$ will be provided whenever there is a break in the succession of 1 msec. counting pulses $P_g$.

In the circuit described above, some fluctuation in the frequency of the input signal $S_a$ can be tolerated, provided that such fluctuation remains within a predetermined range. The circuit in the above described embodiment is so designed that, when the input signal $S_a$ has a frequency of precisely 1 KHz, each pulse $P_g$ will occur at a time which is substantially midway between the 95th and 106th pulses registered on first counter 26. If the pulse $P_g$ occurs at a time before the 95th pulse, or after the 106th pulse is registered, the output of the third flip-flop 28 will then be at the first or high level, and a counting pulse $P_j$ will not be provided. However, if the pulse $P_g$ occurs at any time after counter 26 has registered the 95th pulse, but before it has registered the 106th pulse, output $S_i$ of flip-flop 28 will be at its second or low level and AND gate 30 will provide counting pulses $P_j$ to the second counter 32 in response to pulses $P_g$. Thus, the output from the AND gate 30 is substantially that of a digital band pass filter with a frequency band extending from 950 Hz to 1050 Hz. The second counter 32 provides an output pulse $P_n$ only when it counts 100 pulses $P_j$ occurring without interruption and filtered, as if by a band pass filter having a pass band of 950–1050 Hz.

It should be noted that first and second counters 26 and 32 together with third flip-flop 28 and logic AND gate 30, constitute a counting means for providing an output $P_n$ upon counting 100 counting pulses occurring in response to the input signal $S_a$ being in the frequency band of 950–1050 Hz.

One particular application of the digital signal selective or detecting circuit of FIG. 1 is in conjunction with a cueing system for detecting a cue signal recorded on video tape, as mentioned above. In broadcasting, and particularly during news broadcasting, it is sometimes necessary to insert recorded program items, including prerecorded news, commentary, commercials, and so forth, between live program items. With reference to FIG. 3, it will be noted that a standard technique for inserting recorded program items involves the use of cue signals $Q_a$, $Q_b$, $Q_c$, ... etc. located on a cue track of the video tape so that, at the normal speed of advancement of the tape, the cue signals will occur five seconds before the commencement of the respective recorded program items, A, B, C, ... etc. The five second interval between each of the cue signals $Q_a$, $Q_b$, $Q_c$ and the respective recorded program item, A, B, C provides a run-up time of five seconds to allow the various servo systems associated with the video tape recorded (VTR) to stabilize and lock before the VTR switches to the inserted program item A, B, C, ... etc.

Initially, the video tape with the recorded items A, B, C recorded thereon is advanced in a VTR until cue signal $Q_a$ is detected by a cue reproducing head. The detected cue signal $Q_a$ is applied from the respective reproducing head as the input signal $S_a$ to the terminal 10 of the digital signal selective or detecting circuit of FIG. 1. Then, after 0.5 seconds, pulse generator 46 provides an output pulse $P_p$ to the tape advancement mechanism, such as, the capstan drive, of the VTR, so as to halt the tape at a position five seconds in advance of the commencement of the first recorded program item A. After the first recorded program item A has been inserted in the broadcast material, the tape continues to run until the next cue signal $Q_b$ is reproduced and causes the tape drive to halt with the tape disposed at a position five seconds in advance of the next recorded program item B. After the next recorded program item B is inserted, reproducing of cue signal $Q_c$ similarly prepares the VTR for subsequent insertion of recorded program item C.

The cueing signals may be recorded along the cue track according to a standard technique. For example, the VTR is first set into the playback mode and the video tape is advanced until the commencement of material desired to constitute a recorded program item. At that time, the VTR is changed-over to a pause mode, and the tape is rewound for 7.5 seconds. Thereafter, the tape is advanced for 2.0 seconds prior to the cue signal $Q_a$ being recorded on the cue track of the tape while the latter is further advanced for 1.0 second.

While the present invention is disclosed herein as being applied to a cueing system for use with a VTR, it is apparent that the digital signal selective or detecting circuit according to the present invention could be applied in various other environments where it is required to detect the occurrence, for a predetermined time, of a periodic input signal having a frequency within a specified range.

Although an illustrative embodiment of the invention has been described in detail herein with reference to the accompanying drawing, it is to be understood that the invention is not limited to that embodiment, and that various changes and modifications may be effected therein by one skilled in the art without departing from the scope or spirit of the invention as defined in the appended claims.

What is claimed is:

1. A digital signal selective circuit responsive to a periodic input signal having an operating characteristic occurring at a desired regular periodic interval for a desired length of time, comprising:
   clock signal generating means for providing reference clock pulses;
   first counting means for counting said reference clock pulses and for registering a resulting count therein which provides a measurement of the length of time since the last occurrence of said operating characteristic;
   means for providing an output pulse in response to said operating characteristic occurring at a time when said count in said first counting means is within a predetermined range, said means for providing an output pulse including bistable circuit means providing a predetermined signal level whenever the count in said first counting means is within said predetermined range, and logic circuit means providing an output pulse in response to the simultaneous occurrence of said predetermined signal level and said operating characteristic; and
   second counting means for counting each said output pulse and providing an output signal when said second counting means attains a predetermined count.

2. A digital signal selective circuit according to claim 1; wherein said periodic input signal oscillates between positive and negative portions with respect to a reference level, and said operating characteristic is the transition from one to the other of said positive and negative portions.

3. A digital signal selective circuit according to claim 1; further comprising delay means responsive to said output signal for providing a signal at a time delayed by a predetermined amount after said second counting means attains said predetermined count.

4. A digital signal selective circuit for responding to a periodic input signal whenever the latter has a frequency within a predetermined range of frequencies for a predetermined length of time, comprising:
input means receiving said input signal;
clock means providing clocking pulses at a frequency substantially greater than the highest frequency in said predetermined range;
counting means for counting said clocking pulses and providing an output after attaining a specified count thereof, said counting means including first and second counters each having an input terminal, an output terminal, a reset terminal and a gating terminal, said clocking pulses being applied to the input terminal of said first counter, and counting pulse generator means connected with said input means and being interposed between the output terminal of said first counter and the input terminal of said second counter for providing a counting pulse to said second counter for each cycle of said periodic input signal whenever the frequency of said input signal is within said predetermined range; the output terminal of said second counter providing said output of the counting means after attaining said specified count;
gating means responsive to said input signal for enabling said counting means whenever said input is present at said input means, said gating means being connected with the gating terminals of said first and second counters;
reset means connected with said counting means and responsive to said input signal for resetting said counting means whenever the frequency of said input signal is outside said predetermined range, thereby preventing said counting means from attaining said specified count when said frequency is outside said range, said reset means being connected with said reset terminals of said first and second counters; and
output means responsive to said output of the counting means for providing an output signal.

5. A digital signal selective circuit for responsing to a periodic input signal whenever the latter has a frequency within a predetermined range of frequencies for a predetermined length of time, comprising:
input means receiving said input signal;
clock means providing clocking pulses at a frequency substantially greater than the highest frequency in said predetermined range;
counting means for counting said clocking pulses and providing an output after attaining a specified count thereof;
gating means responsive to said input signal for enabling said counting means whenever said input is present at said input means;
output means responsive to said output of the counting means for providing an output signal, said output means including delay circuit means providing said output signal a specified time after said counting means attains said specified count; and
reset means connected with said counting means and responsive to said input signal for resetting said counting means whenever the frequency of said input signal is outside said predetermined range thereby preventing said counting means from attaining said specified count when said frequency is outside said range, said reset means being connected with said delay circuit means for resetting said counting means said specified time after said counting means attains said specified count.

6. A digital signal selective circuit for responding to a periodic input signal whenever the latter has a frequency within a predetermined range of frequencies for a predetermined length of time, comprising
input means receiving said input signal;
first pulse generating means connected with said input means and providing a first pulse at the beginning of each period during which the input signal has a frequency within said predetermined range;
second pulse generating means connected with said input means providing second pulses approximately at the frequency of said input signal;
clock generator means providing clock pulses at a frequency substantially greater than the highest frequency of said predetermined range;
a first counter having an input terminal receiving said clock pulses, and output terminal, a gate terminal, and a reset terminal;
counting pulse generator means connected with the output terminal of said first counter and with said second pulse generator means for providing a counting pulse whenever one of said second pulses occurs at a time when said first counter has attained a count between first and second predetermined counts;
a second counter having an input terminal receiving each said counting pulse, an output terminal, a gate terminal, and a reset terminal;
gate signal generator means connected with said first pulse generating means and with said counting pulse generator means for providing a gating signal to the gate terminals of said first and second counters, said gate signal generator means providing said gating signal with a first value for a predetermined period in response to the occurrence of any one of said first pulse and said counting pulse, and said gating signal generator means providing said gating signal with a second value when both said first pulse and said counting pulse are absent for a length of time at least equal to said predetermined period;
reset means for providing a reset signal to the reset terminals of said first and second counters in response to a transition of said gating signal between said first and second values; and
output means connected with the output terminal of said second counter for providing said output signal whenever said second counter attains a predetermined count.

7. A digital signal selective circuit according to claim 6; wherein said input means includes waveshaping means receiving the input signal for producing a shaped signal of predetermined amplitude and having the frequency of said periodic input signal, said shaped signal being applied to said first and second pulse generating means.

8. A digital signal selective circuit according to claim 7; wherein said waveshaping means includes a Schmitt trigger.

9. A digital signal selective circuit according to claim 6; wherein said second pulse generating means includes means for synchronizing said second pulses with said clock pulses.

10. A digital signal selective circuit according to claim 6; wherein said second pulse generating means comprises a first bistable circuit having input terminals connected to said input means, an output terminal, and an inverse output terminal, and a pulse generator providing said second pulses in response to transitions in level at said output terminal of the bistable circuit.

11. A digital signal selective circuit according to claim 10; wherein said first pulse generating means includes a second bistable circuit having an input terminal, a clear terminal, and an output terminal, said input terminal being connected to said inverse output terminal of the first bistable circuit, said clear terminal being connected with said reset means to receive said reset signal, and another pulse generator providing each said first pulse in response to a transition in level at said output terminal of said second bistable circuit.

12. A digital signal selective circuit according to claim 6; wherein said gate signal generator means includes a logic circuit having inputs connected with said first pulse generating means and with said counting pulse generating means, said logic circuit having an output at which a logic signal is provided whenever a pulse appears at one of said inputs thereof, and a monostable multivibrator providing said gating signal of said first value in response to said logic signal.

13. A digital signal selective circuit according to claim 12; wherein, in the absence of said first pulse and said counting pulses, said gating signal has said first value for a predetermined period exceeding the period of the lowest frequency in said predetermined range.

14. A digital signal selective circuit according to claim 13; wherein said predetermined period is approximately 3/2 the period of said lowest frequency.

15. A digital signal selective circuit according to claim 6; wherein said counting pulse generator means includes a bistable circuit having an input terminal, a clear terminal, and an output terminal, said input terminal of the bistable circuit being connected with said first counter and said clear terminal being connected with said first counter so that an output of said bistable circuit appearing at said output terminal shifts from a first level to a second level when said first counter attains said first predetermined count and shifts from said second level back to said first level when said first counter attains said second predetermined count, and a logic circuit connected to said output terminal of said bistable circuit and to said second pulse generating means for providing said counting pulse whenever said second pulse occurs while said output of said bistable circuit is at said second level.

16. A digital signal selective circuit according to claim 6; wherein said reset means includes a pulse generator connected with said gate signal generator means said said counters and providing said reset signal in response to a transition of said gating signal between said first and second values.

17. A digital signal selective circuit according to claim 16; wherein said reset means further includes logic OR gates between said pulse generator of said reset means and each of said first and second counters, each of said OR gates having inputs and an output, said reset signal being applied to one input of each said OR gate, the outputs of said OR gates being connected to respective reset terminals of said first and second counters; and a delay circuit connected with the output terminal of said second counter providing a delayed signal delayed by a predetermined amount after said second counter attains said predetermined count, said delayed signal being applied to another input of each of said OR gates.

18. A digital signal selective circuit according to claim 17; wherein said second pulse generator means is connected to an input of the OR gate having its output connected with said first counter, so that said second pulses are applied to said input of said OR gate having its output connected with said first counter.

19. A digital signal selective circuit according to claim 6; wherein said output means includes a delay circuit connected with said second counter for providing a delayed signal a predetermined time after said second counter attains said predetermined count.

20. A digital signal selective circuit according to claim 19; wherein said output means further includes a pulse generator connected with said delay circuit for providing an output pulse in response to said delayed signal.

* * * * *